United States Patent
Gold et al.

(10) Patent No.: US 10,206,313 B1
(45) Date of Patent: Feb. 12, 2019

(54) SYSTEMS AND METHODS FOR CONFIGURING INFORMATION TECHNOLOGY RACKS

(71) Applicant: Facebook, Inc., Menlo Park, CA (US)

(72) Inventors: Andrew Gold, Los Altos, CA (US); Scott C. Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/729,418

(22) Filed: Oct. 10, 2017

(51) Int. Cl.
- *H05K 5/00* (2006.01)
- *H05K 7/20* (2006.01)
- *B65G 1/04* (2006.01)
- *H05K 7/14* (2006.01)

(52) U.S. Cl.
CPC ....... *H05K 7/20836* (2013.01); *B65G 1/0407* (2013.01); *H05K 7/1491* (2013.01)

(58) Field of Classification Search
CPC . H05K 7/20836; H05K 7/1491; B65G 1/0407
USPC ........................................................ 361/731
See application file for complete search history.

(56) References Cited

U.S. PATENT DOCUMENTS

| | | | |
|---|---|---|---|
| 6,904,005 B2 * | 6/2005 | Emberty | G06F 1/26 361/752 |
| 9,198,310 B2 * | 11/2015 | Eichelberg | H05K 7/20745 |
| 2009/0168345 A1 * | 7/2009 | Martini | F24F 11/0001 361/691 |
| 2017/0359922 A1 * | 12/2017 | Bailey | H05K 7/1498 |

* cited by examiner

Primary Examiner — Hung S Bui
(74) Attorney, Agent, or Firm — FisherBroyles, LLP

(57) ABSTRACT

A system may include an information technology rack for holding information technology device modules such that heat generated by the information technology device modules primarily vents in one direction. The information technology rack may be adjacent to both (1) a data center hot aisle into which the information technology rack ventilates air heated by one or more of the information technology device modules and (2) a data center cold aisle that is separated from the data center hot aisle by the information technology rack. The system may also include at least one information technology device module positioned on the information technology rack such that (1) the information technology device module is accessible for removal via the data center hot aisle and (2) at least one cable connected to the information technology device module is positioned in the data center cold aisle. Various other systems and methods are also disclosed.

20 Claims, 11 Drawing Sheets

SYSTEMS AND METHODS FOR CONFIGURING INFORMATION TECHNOLOGY RACKS

BACKGROUND

Demand for computational resources from organizations and individuals continues to grow. Increasingly, data centers meet this demand by providing large amounts of data processing and data storage capacity in a concentrated physical space. Some data centers may provide computing as a service, giving customers the flexibility to consume computational resources on an as-needed basis while sparing the customers the financial and administrative burdens of maintaining the underlying physical computing infrastructure. Other data centers may provide large-scale computation for a single organization. In either case, the optimization of data centers becomes increasingly central to computation as data centers grow and proliferate.

Optimizing data centers may involve many factors: power consumption, cooling, device cost, device reliability, device administration (installing, configuring, maintaining, replacing, moving, and removing devices), scalability, redeployment flexibility, human environmental comfort, human accessibility to devices, physical plant construction and maintenance, and physical plant footprint are examples of such factors. Unfortunately, due to competing constraints (e.g., power consumption vs. cooling, scalability vs. physical plant footprint), optimizing data centers often poses a difficult problem. However, due to the highly commoditized nature of computing, an improvement to data center design can unlock a tremendous amount of value for data center operators and consumers.

SUMMARY

As will be described in greater detail below, the instant disclosure generally relates to systems and methods for configuring information technology racks in a manner that allows data centers to operate more efficiently. In one example, a system for accomplishing such a task may include an information technology rack for holding information technology device modules such that heat generated by the information technology device modules primarily vents in one direction. In addition, the information technology rack may be positioned such that the information technology rack is adjacent to both a data center hot aisle into which the information technology rack ventilates air heated by one or more of the information technology device modules and a data center cold aisle that is separated from the data center hot aisle by the information technology rack. The system may also include at least one information technology device module positioned on the information technology rack such that the information technology device module is accessible for removal via the data center hot aisle and at least one cable connected to the information technology device module is positioned in the data center cold aisle.

In some examples, each cable connected to the information technology device module may be positioned in the data center cold aisle. In one example, at least one cable connected to the information technology device module that is positioned in the data center cold aisle may be connected to the information technology device module via a blind mate connection. In some embodiments, at least one cable connected to the information technology device module that is positioned in the data center cold aisle may be rigidly held by the information technology rack. In one example, at least one cable may be a network cable that connects the information technology device module to a network.

In some embodiments, the information technology device module may be a currently operative part of a data center infrastructure and may store, send, and/or receive data. In some embodiments, the information technology device module may be accessible for modification via the data center hot aisle.

According to various embodiments, a corresponding information-technology-rack configuration system may include an information technology rack that holds information technology device modules such that heat generated by the information technology device modules primarily vents in one direction. In this example, the information technology rack may be adjacent to both a data center hot aisle into which the information technology rack ventilates air heated by one or more of the information technology device modules and a data center cold aisle that is separated from the data center hot aisle by the information technology rack. The system may also include at least one information technology device module positioned on the information technology rack such that the information technology device module is accessible for removal via the data center hot aisle. The system may additionally include a rack-maintenance apparatus that is configured to replace the information technology device module with a replacement information technology device module via the data center hot aisle.

The information-technology-rack configuration system may be installed, oriented, and/or arranged in any suitable manner. For example, the system may include a rack-maintenance apparatus that is configured to replace the information technology device module with a replacement information technology device module via the data center hot aisle. In some examples, the rack-maintenance apparatus may include a gantry robot adapted to move a sliding element parallel to a face of the information technology rack that is adjacent to the data center hot aisle. In some embodiments, the system may include a module-dispensing apparatus within the data center hot aisle that stores at least one replacement information technology device module for an information technology device module currently positioned on the information technology rack. In some embodiments, the gantry robot may be configured to retrieve modules from the module-dispensing apparatus.

In one embodiment, the system may include a cable-configuration apparatus that connects at least one cable to the information technology rack via the data center cold aisle prior to the information technology device module being connected to the cable. In this embodiment, the cable may (1) connect the information technology device module to an additional information technology device module, a power source, and/or a network and (2) be positioned in the data center cold aisle. In some examples, the system may include a set of cables that includes both a network cable and a power cable, where each cable within the set of cables is coupled to the information technology device module via a blind mate connection. In one embodiment, the system may include a cooling apparatus that cools the data center cold aisle.

In addition to the various systems and devices described herein, the instant disclosure presents, by way of example, methods associated with information-technology-rack configuration systems. For example, a method may include orienting an information technology rack for holding information technology device modules such that (1) heat generated by the information technology device modules primarily vents in one direction and (2) the information technology rack is adjacent to both (a) a data center hot aisle into which the information technology rack ventilates air heated by one or more of the information technology device modules and (b) a data center cold aisle that is separated from the data center hot aisle by the information technology rack. The method may also include positioning at least one information technology device module on the information technology rack such that (1) the information technology device module is accessible for removal via the data center hot aisle and (2) at least one cable connected to the information technology device module is positioned in the data center cold aisle.

In some examples, the method may further include connecting at least one cable to the information technology device module via the data center cold aisle. In some embodiments, positioning the information technology device module may include connecting at least one cable to the information technology device module via a blind mate connection.

In some examples, the method may further include replacing the information technology device module with a replacement information technology device module via the data center hot aisle. In one example, the method may further include modifying the information technology device module via the data center hot aisle. In one embodiment, the method may further include installing, via a cable-configuration apparatus, the cable in the data center cold aisle prior to installing the information technology device module.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
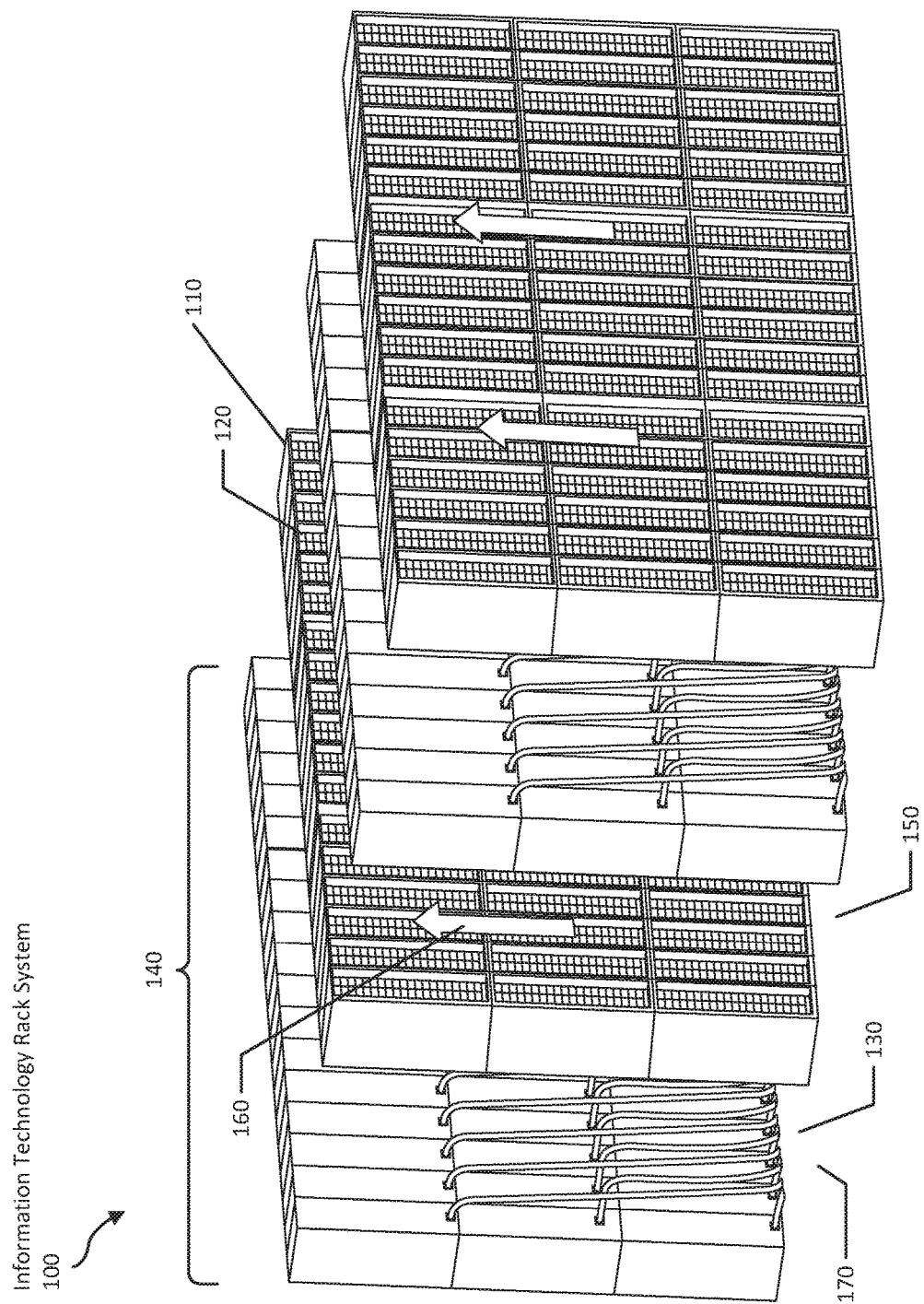
FIG. 1 is a perspective view of an exemplary configuration of information technology racks.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various systems and methods for configuring information technology racks. The systems and methods disclosed herein may provide various features and advantages over conventional approaches to data center management. For example, the configurations disclosed herein may allow for quick deployment of various computing devices within data centers (for example, by replacing modules without the obstruction of cables). In addition, the deployment mechanisms disclosed herein may facilitate more efficient arrangements of data center facilities. For example, the deployment mechanisms disclosed herein may facilitate the arrangement of cables in cold aisles that may increase the efficiency, performance, and/or longevity of the cables. In some examples, the deployment mechanisms may also facilitate module deployment/removal from within hot aisles that would typically be unsuitable for human work, providing potential savings in terms of human labor and/or cable maintenance.

In addition, the deployment mechanisms described herein may simplify or remove design constraints from data center layouts. In some examples, the deployment mechanisms described herein may make quickly rearranging and/or replacing modules more practical, thereby potentially improving flexibility, scalability, and/or disaster recovery in data centers. In some examples, the deployment mechanisms described herein may also make as-needed deployment adjustments more practical, thereby potentially improving data center performance. Furthermore, by reducing time spent on deploying modules, the deployment mechanisms described herein may free time for information technology workers to concentrate on higher-level considerations in data center configuration and maintenance.

The following will provide, with reference to FIGS. 1-3 and 5, examples configurations of information technology racks. In addition, the discussion associated with FIGS. 4 and 5-10 will provide examples of module-dispensing, cable-holding, blind mate, rack maintenance, additional rack maintenance, and cable-configuration apparatuses, respectively. Finally, the discussion corresponding to FIG. 11 will provide examples of methods for manufacturing, assembling, configuring, installing, and/or using the information technology rack configuration mechanisms presented herein.

FIG. 1 illustrates an exemplary information technology rack system 100 for holding information technology device modules. System 100 may include one or more information technology racks 110. The term "information technology rack," as used herein, generally refers to any structure adapted to support one or more information technology device modules 120 and/or physical accessories accompanying the information technology device modules, such as cables 130. The term "information technology device module," may refer to any modular device that may include and/or form a part of a computing system. Examples of information technology device modules include, without limitation, servers, power supplies, network switches, and battery backup units. An information technology device module may take any suitable form. In some embodiments, an information technology device module may include a currently operative part of a data center infrastructure capable of storing, sending, and/or receiving data. In some embodiments, an information technology device module may be a device capable of generating, storing, and/or distributing power. In one embodiment, an information technology device module may be a power supply for one or more other information technology device modules, such as a power supply for a server. Additionally or alternatively, an information technology device module may be any element that aids in data center operation, such as a cooling element, a light signaling device, and/or any other suitable data center component that is adapted to be held by a data center rack.

In some embodiments, an information technology rack may be part of a larger rack structure, such as rack structure 140, that includes a number of racks all oriented in the same direction. In some examples, rack structure 140 may include racks that are stacked vertically and/or horizontally. In some embodiments, a number of rack structures may be arranged facing in alternating directions. In some embodiments, rack 110 may hold information technology device modules 120 such that heat generated by the information technology device modules primarily vents in one direction, creating a data center hot aisle 150 into which the information technology rack ventilates hot air 160 that is heated by one or more of the information technology device modules positioned on the rack. In these embodiments, rack 110 may also be adjacent to a data center cold aisle 170 that is separated from data center hot aisle 150 by rack 110 and into which little to no hot air is vented. In embodiments that include multiple rack structures 140 arranged in alternating directions, such as in data centers, racks may be surrounded by alternating hot and cold aisles. The term "hot aisle," as used herein, generally refers to any space adjacent to an information technology rack into which hot air from one or more devices is primarily vented. The term "cold aisle," as used herein, generally refers to any space adjacent to an information technology rack into which hot air is not primarily vented and/or which is cooled by one or more cooling mechanisms.

Information technology device module 120 may be positioned on a rack such that at least one cable 130 connected to information technology device module 120 is positioned in data center cold aisle 170. In some embodiments, all cables connected to information technology device module 120 may be connected to information technology device module 120 via the cold aisle. For example, a network cable that connects information technology device module 120 to a network (e.g., a local area network within the data center), a signal cable, and/or a power cable that supplies information technology device module 120 with power may be connected to information technology device module 120 via cold aisle 170. In some examples, some types of cables may experience increased efficiency, performance, and/or longevity when operating in moderate or cold temperatures as opposed to hot temperatures. In some embodiments, cable 130 may run beneath the floor of the data center. In one embodiment, each individual cable may enter the floor through a different opening in the floor. In another embodiment, bundles of cables, such as all the cables connected to a single rack and/or all the cables connected to a vertical stack of modules within a rack, may enter the floor through the same opening in the floor. Additionally or alternatively, cables may run along the spines of data center racks and may enter the ceiling rather than entering the floor.

In some embodiments, information technology device module 120 may be positioned on a rack such that information technology device module 120 is accessible for removal and/or modification via data center hot aisle 150. For example, and as will be explained in greater detail below in connection with FIG. 7, information technology device module 120 may be replaced, reconfigured, and/or repaired via hot aisle 150. In some embodiments, positioning the cables on the cold aisle side of the rack may render the information technology device module accessible via the hot aisle side of the rack. In some embodiments, rack 110 may have an opening and/or may be otherwise configured to enable access to information technology modules via the hot aisle. In one example, and as will be described in greater detail below in connection with FIGS. 4-5, information technology module 120 may be removed from the rack and replaced with a replacement information technology module via the hot aisle. For example, if information technology module 120 is a server that experiences a hard disk failure, the faulty server may be removed and a working server inserted into the rack via the hot aisle.

Figure 2:
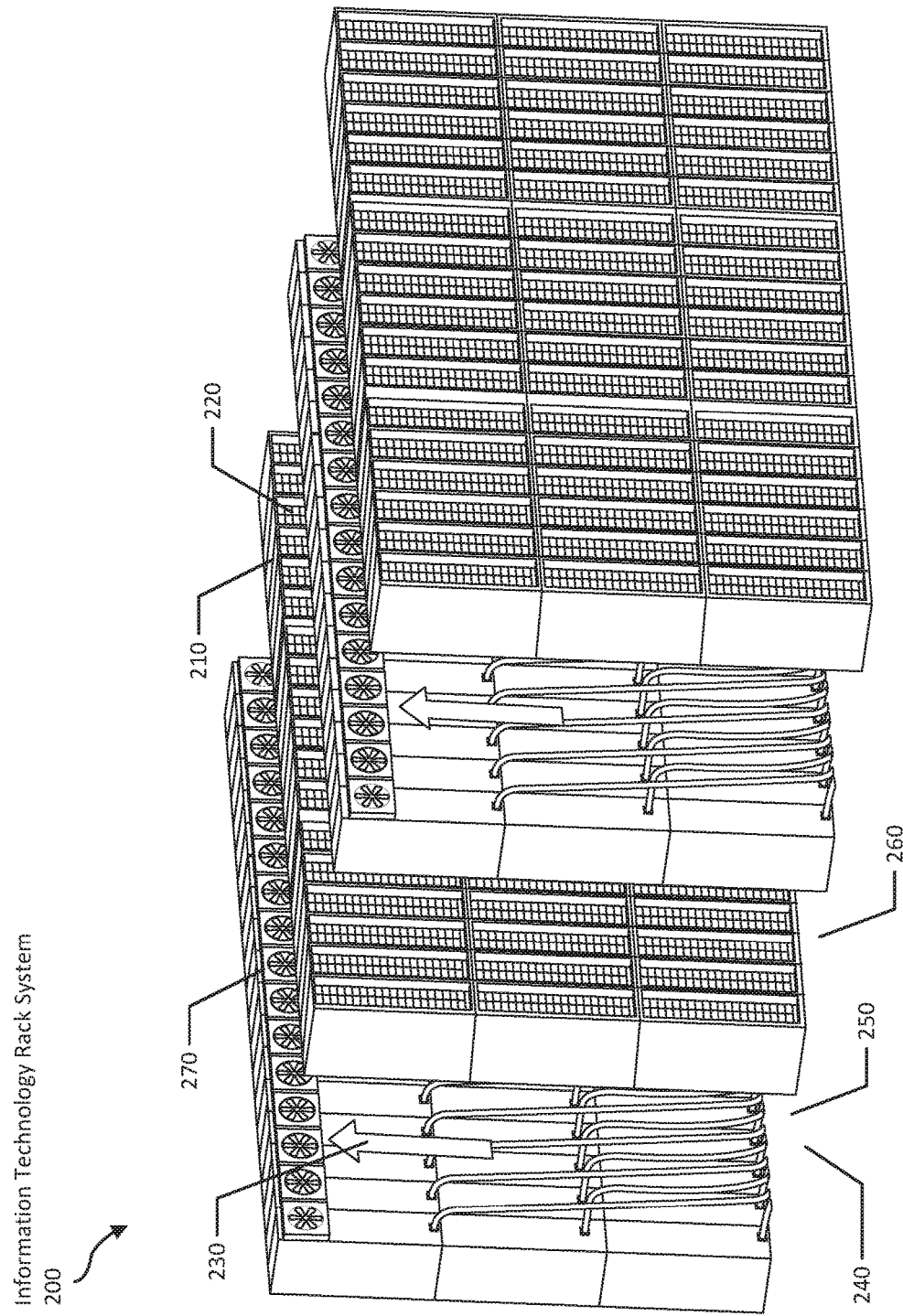
FIG. 2 is a perspective view of an additional exemplary configuration of information technology racks.

FIG. 2 illustrates an information technology rack system 200 in an alternative configuration. In this configuration, information technology rack 210 holds information technology device module 220 such that heated air 230 vents into hot aisle 240 via vent 270. In this configuration, cables 250 are positioned in hot aisle 240 and information technology device module 220 is accessible for removal via cold aisle 260. This configuration may suffer from drawbacks compared to the configuration illustrated in FIG. 1, such as a decrease in function and/or lifespan experienced by cables 250 due to the hot environment.

Figure 3:
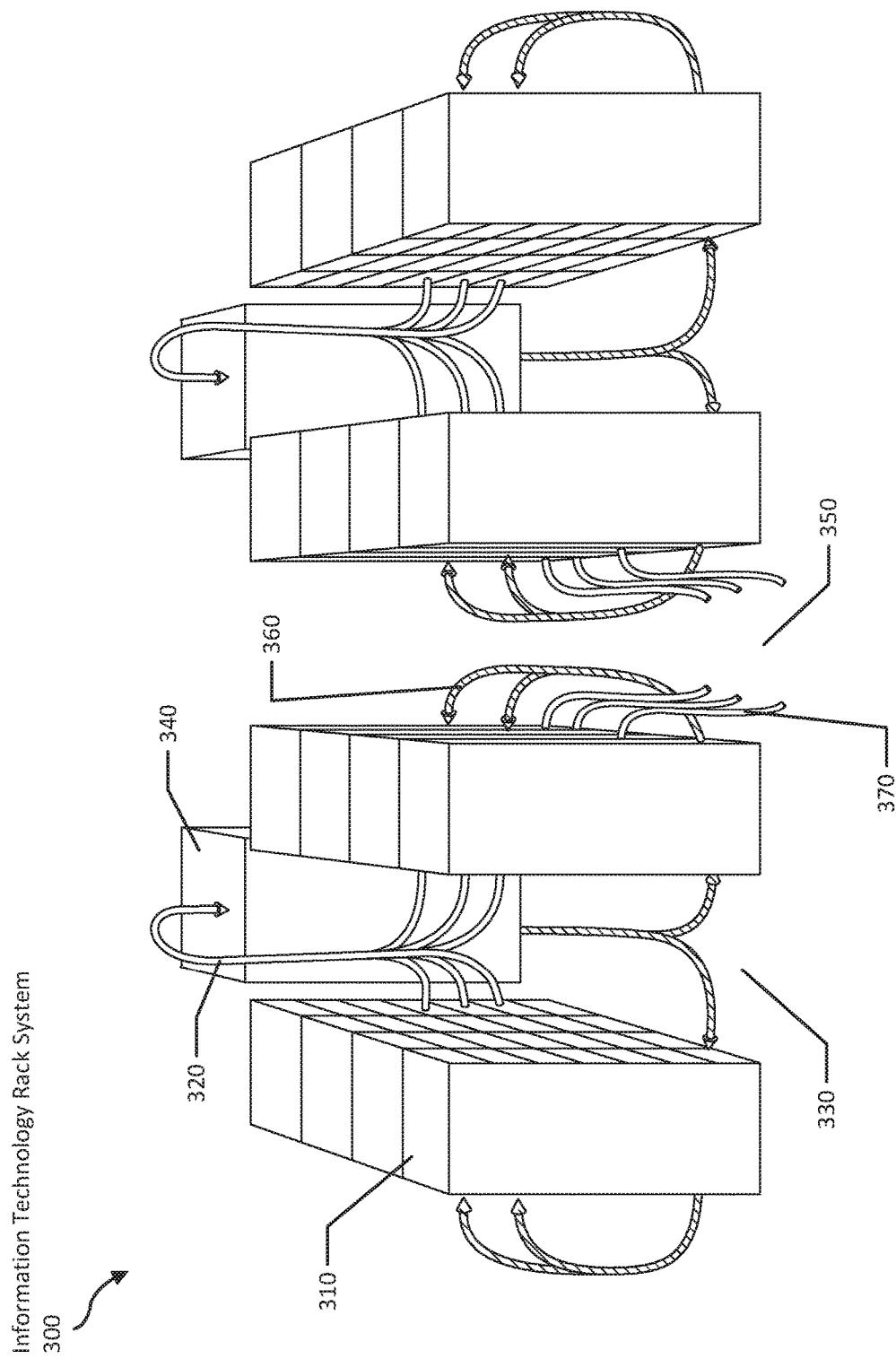
FIG. 3 is a perspective view of an exemplary configuration of information technology racks with a cooling apparatus.

FIG. 3 shows an exemplary information technology rack system 300 arranged with alternating hot aisles and cold aisles. In one example, one or more modules positioned in rack 310 may vent hot air 320 into hot aisle 330. In this example, a cooling apparatus 340 may be located in hot aisle 330 and may be configured to cool and circulate cool air 360 in order to maintain a cooler temperature in a cold aisle 350 than is maintained in hot aisle 330. In other embodiments, cooling apparatus 340 may be located in cold aisle 350. By maintaining a cooler temperature in cold aisle 350, cooling apparatus 340 may ensure that cables 370 do not experience high temperatures that may degrade the lifespan and/or performance of cables 370. Cooling apparatus 340 generally represents any type of apparatus designed to lower the temperature in an area including, without limitation, fans, evaporative cooling, air conditioning, and/or heat sinks. In some examples, one or more cooling apparatuses may be located in every hot aisle and/or every cold aisle. In some embodiments, information technology rack system 300 may be arranged such that the hot aisles are insulated from the cold aisles by the racks and/or other physical barriers, enabling cooling apparatus 340 to efficiently cool the cold aisles.

Figure 4:
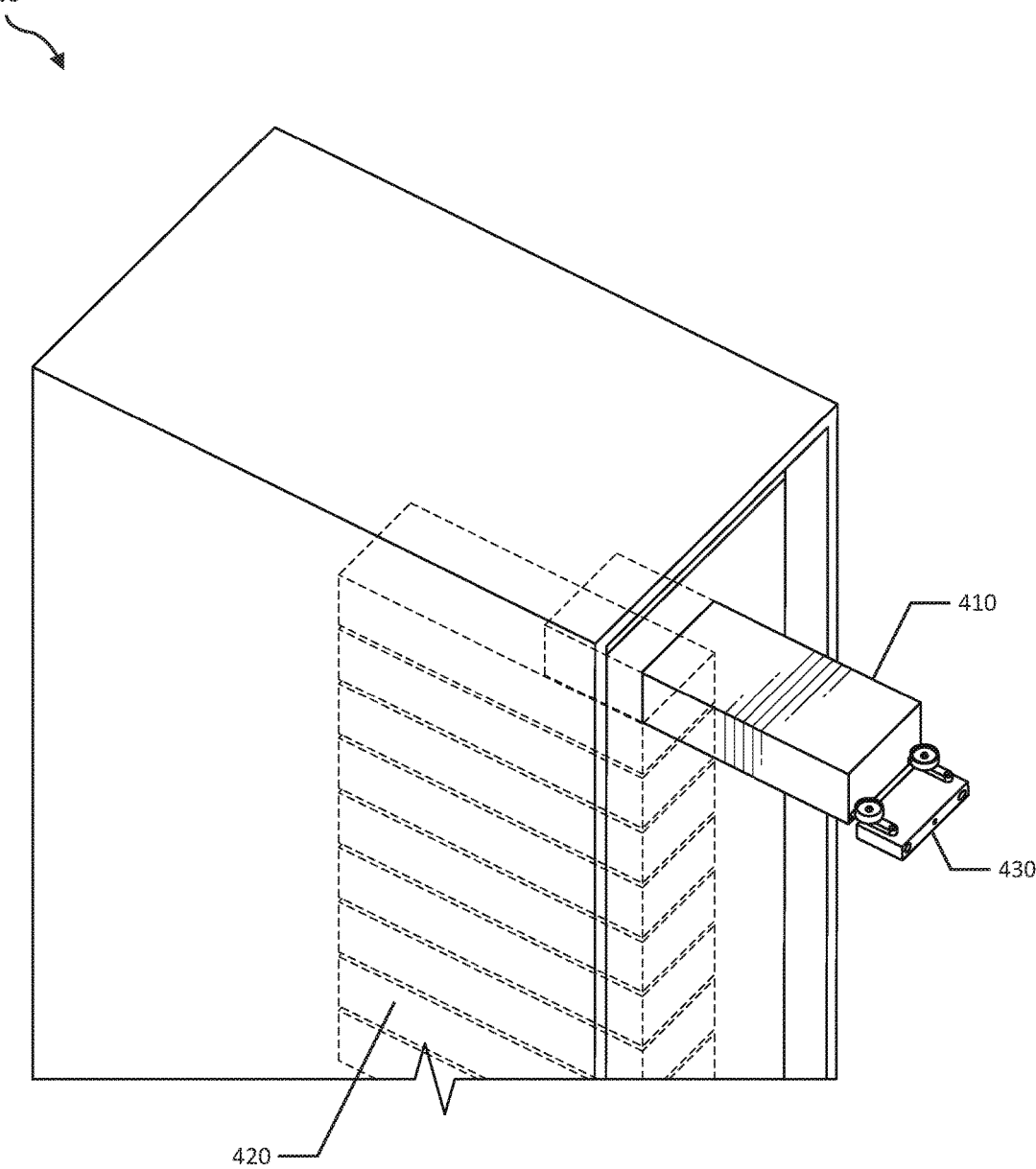
FIG. 4 is a perspective view of an exemplary module-dispensing apparatus.

FIG. 4 shows an example module-dispensing apparatus 400. As shown in FIG. 4, engaging element 430 may remove a module 410 from apparatus 400 (e.g., in order to install module 410 in an information technology rack, such as rack 110 in FIG. 1). In some examples, apparatus 400 may be adapted to replace a removed module with a new module to dispense. For example, once module 410 is removed from apparatus 400, a stack 420 of modules (no longer blocked by module 410) may rise, allowing access to the top module in stack 420. In other configurations, the orientation may be reversed, and a stack from above may descend when a module is removed from a module-dispensing apparatus.

Figure 5:
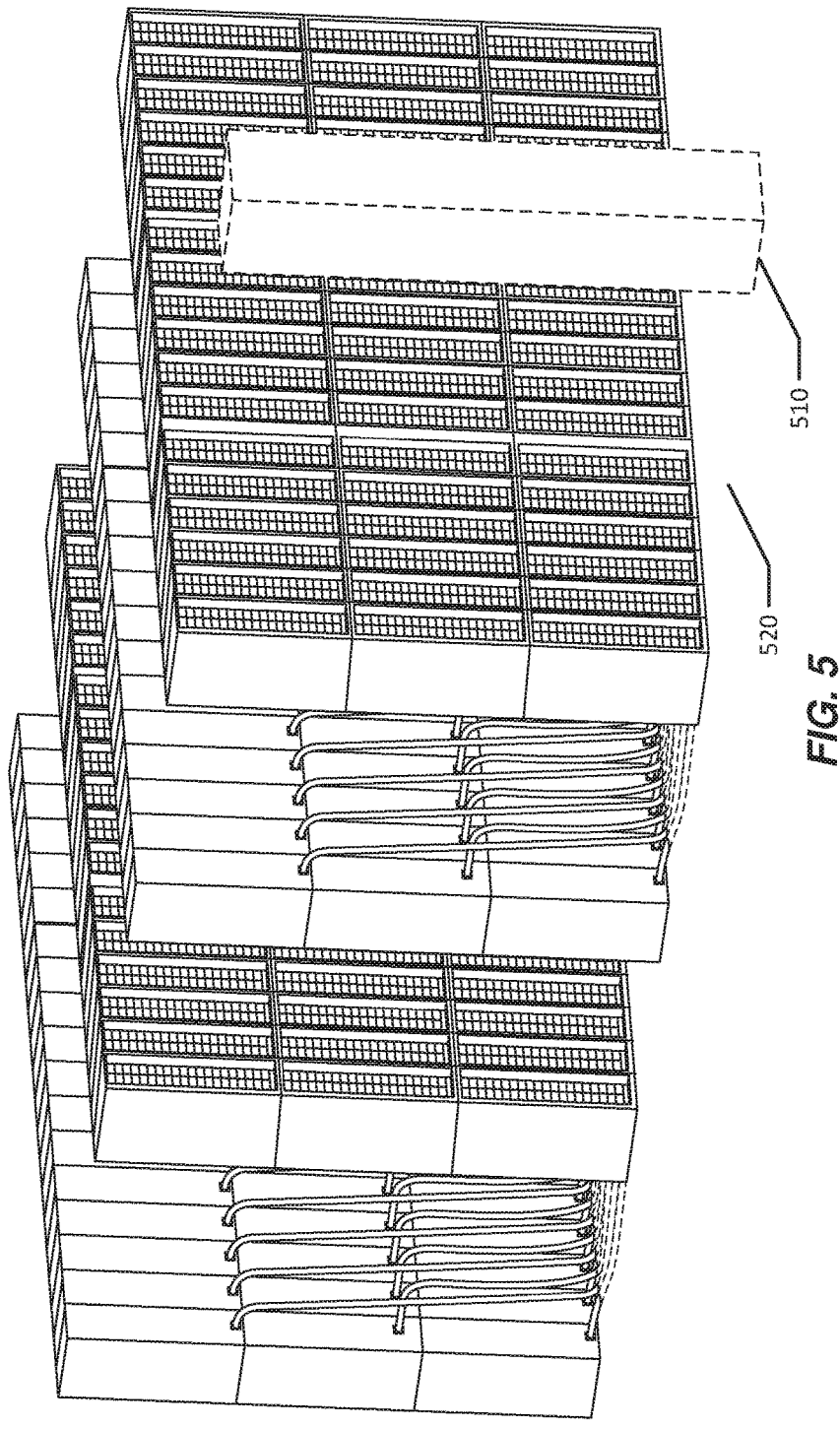
FIG. 5 is a perspective view of an exemplary configuration of information technology racks with a module-dispensing apparatus.

FIG. 5 shows an exemplary information technology rack system 500 with the addition of module-dispensing apparatus 400 at location 510 in hot aisle 520. Module-dispensing apparatus 400 may store replacement information technology modules and/or components for information technology modules (e.g., connectors, removable memory, and/or cables) for information technology device modules currently positioned on the rack. Additionally or alternatively, module-dispensing apparatus 400 may store information technology device modules of a type not currently positioned on the rack (e.g., different models of servers with differing performance characteristics). In some embodiments, one or more module-dispensing apparatuses may be located in each hot aisle of a data center and may store replacement modules and/or components for modules accessible via that hot aisle. By storing additional and/or replacement modules and/or components in the hot aisle, the module-dispensing apparatus may enable efficient maintenance of modules via the hot aisle even in data center configurations that render the hot aisle difficult to access externally. For example, and as explained in greater detail below, a robot operating in the hot aisle may replace malfunctioning modules with replacement modules already stored in a module-dispensing apparatus in the hot aisle without requiring any external access to the hot aisle.

Figure 6:
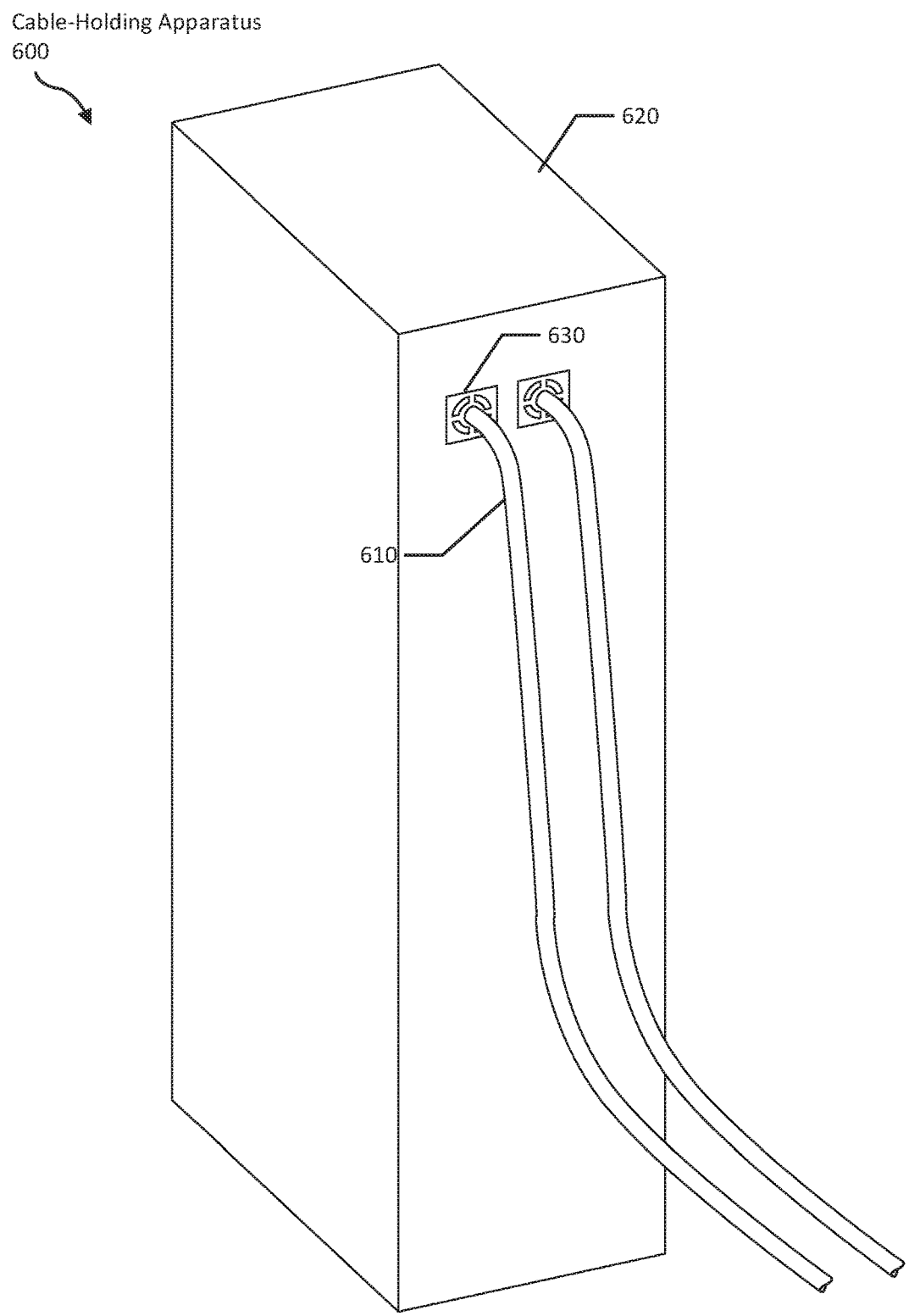
FIG. 6 is a perspective view of an exemplary cable-holding apparatus.

FIG. 6 shows an exemplary cable-holding apparatus 600 for rigidly holding cable 610 in information technology rack 620 via an apparatus 630. Apparatus 630 may represent any suitable mechanism capable of holding a cable in place with no or minimal movement, such as a clamp or arrangement of clamps, a narrow opening, and/or a cinch. In some embodiments, information technology rack 620 may hold multiple separate cables via rigid cable-holding apparatuses. Additionally or alternatively, cable 610 may represent a bundle of cables that includes multiple cables (e.g., network cables, signal cables, and/or power cables) held by information technology rack 620 in a single cable-holding apparatus. In some embodiments, information technology device modules positioned on information technology rack 620 may be connected by short lengths of cable within information technology rack 620. Additionally or alternatively, each information technology device module positioned on information technology rack 620 may be connected by separate cables from outside of information technology rack 620. In some embodiments, apparatus 630 may be positioned on the side of information technology rack 620 that faces a data center cold aisle. By rigidly holding the cable, apparatus 630 may enable the cable to be connected to an information technology device module with a blind mate connector via the simple procedure of sliding the information technology device module into place in the information technology rack such that the back of the information technology device module is snug against the back of the rack where the cable is held.

Figure 7A:
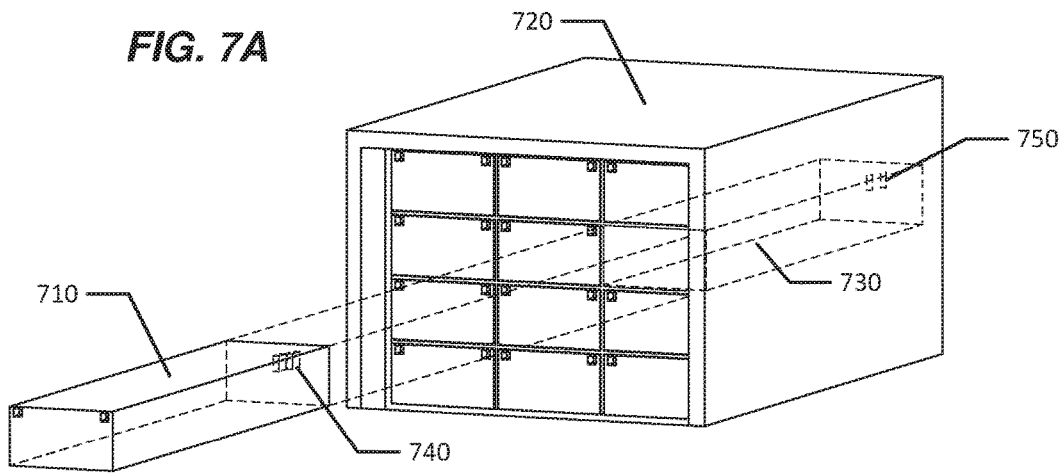
FIG. 7A is a perspective view of an exemplary blind mate connector in a disconnected state.

FIG. 7A shows an exemplary information technology device module 710 in the process of being inserted into slot 730 of an information technology rack 720. Information technology device module 710 is configured with a blind mate connector 740 that matches with blind mate connector 750 at the back of slot 730. The term "blind mate," as used herein, generally refers to any type of connector that enables mating action without the use of tools, such as via a sliding action. In some embodiments, a blind mate connector may also have tolerance for imprecise alignments, allowing a connection to be made without dexterous manipulation of the parts of the connector. For example, a blind mate connector may establish a connection by the two parts of the connector being pushed against one another. In some embodiments, information technology device module 710 may be configured with only one blind mate connector. In other embodiments, information technology device module 710 may be configured with multiple blind mate connectors that may enable information technology device module 710 to connect with multiple cables and/or other components held by and/or positioned on information technology rack 720. In some embodiments, blind mate connector 750 on information technology rack 720 may be connected to a cable (e.g., on the back of information technology rack 710, not visible in FIG. 7A) that is positioned in a data center cold aisle.

Figure 7B:
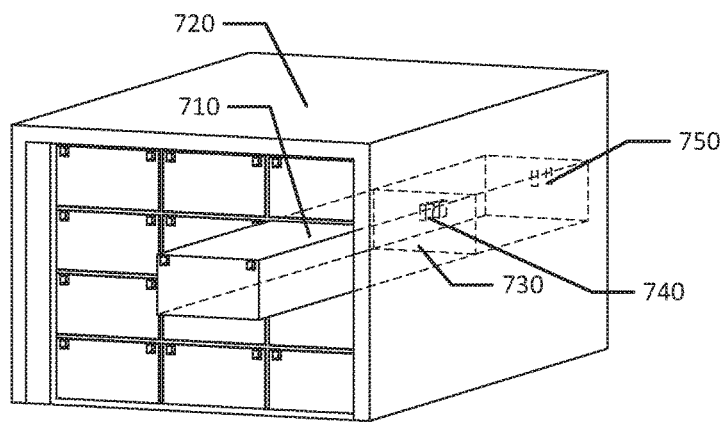
FIG. 7B is a perspective view of an exemplary blind mate connector in an additional disconnected state.

FIG. 7B shows information technology device module 710 partially inserted into slot 730 in information technology rack 720 such that blind mate connector 740 on information technology device module 710 is aligned with blind mate connector 750 in information technology rack 720.

Figure 7C:
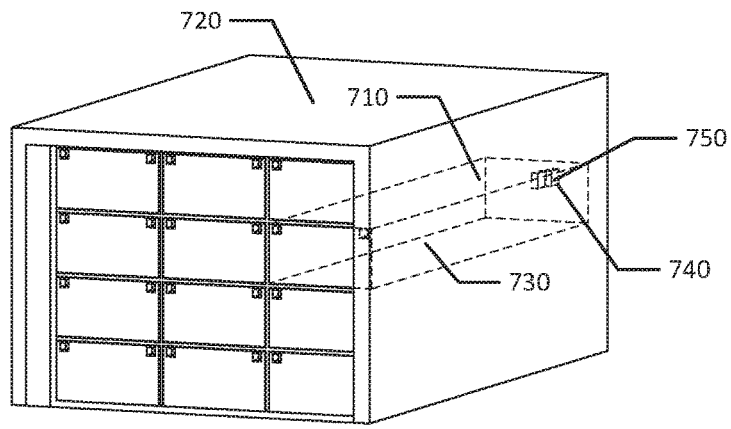
FIG. 7C is a perspective view of an exemplary blind mate connector in a connected state.

FIG. 7C shows information technology device module 710 fully inserted into slot 730 in information technology rack 720 such that blind mate connector 740 is connected to blind mate connector 750.

Figure 8:
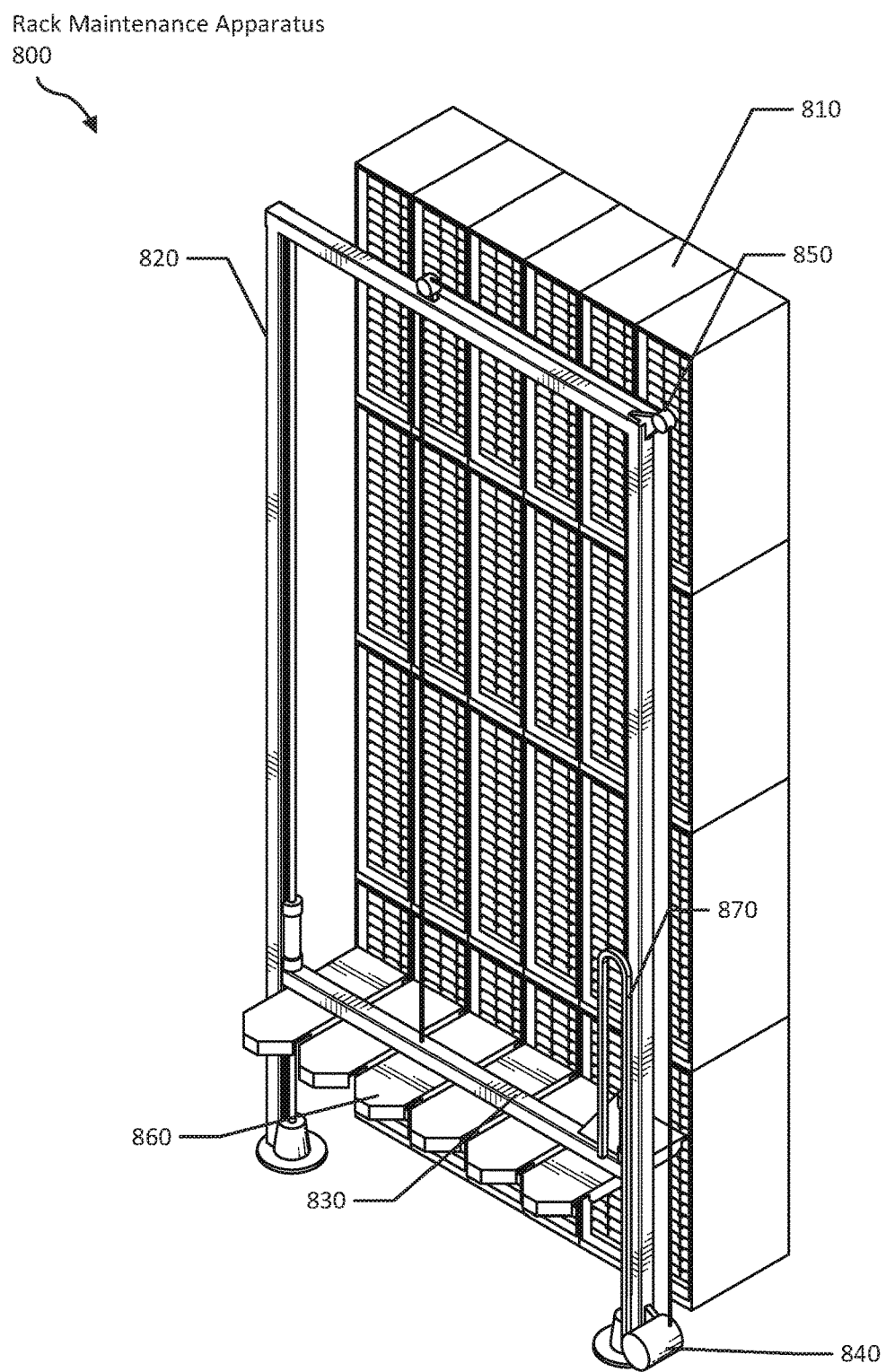
FIG. 8 is a perspective view of an exemplary rack maintenance apparatus.

FIG. 8 shows an exemplary rack maintenance apparatus 800. As seen in FIG. 8, a gantry robot 820 may be positioned in front of an information technology rack 810. The term "gantry," as used herein, may refer to any rigid structure adapted to provide movement for an operative assembly across an area defined by the rigid structure. Accordingly, the term "gantry robot," as used herein, may refer to any gantry adapted to provide such movement for an operative assembly to perform programmable, automated tasks. For example, gantry robot 820 may be adapted to move a sliding element 830 parallel to the face of an information technology rack 810 that exposes information technology devices stored by information technology rack 810. In one example, a motor 840 may drive sliding element along the frame of gantry robot 820. For example, motor 840 may drive a pulley 850 to move sliding element 830 up or down the frame of gantry robot 820.

In some examples, a track may be coupled to sliding element 830. The track may extend away from sliding element 830 and toward the face of the information technology rack. For example, sliding element 830 may support one or more trays, including a tray 860. In this example, tray 860 may include a track that runs perpendicular to sliding element 830. Thus, the track may be coupled to sliding element 830 via tray 860. Rack maintenance apparatus 800 may also include an engaging element (e.g., on the underside of tray 860, not visible in FIG. 8) that is adapted to move along the track and to engage with one or more of the information technology device modules stored by information technology rack 810, such that the engaging element is adapted to insert into information technology rack 810 and remove from information technology rack 810 one or more of the information technology device modules.

In some embodiments, gantry robot 820 may be positioned in a data center hot aisle. Because humans do not typically operate in hot aisles, the presence of a gantry robot in a hot aisle may enable data center operators to perform actions in hot aisles that would normally be unavailable, such as replacing modules via hot aisles. Blind mate connectors and/or rigidly held cables, described above, may enable a gantry robot to connect modules by simply sliding modules into place on a rack rather than performing the complex manipulations of modules and/or cables often involved in connecting cables to modules via other types of connectors. In embodiments where all of the cables connected to modules are positioned in the cold aisle, the lack of cables in the hot aisle may enable a gantry robot to operate freely in the hot aisle without the potential of the gantry robot becoming entangled by cables. In some embodiments, gantry robot 820 may be configured to retrieve replacement modules and/or components from a module-dispensing apparatus such as module-dispensing apparatus 400 in FIG. 4.

Figure 9:
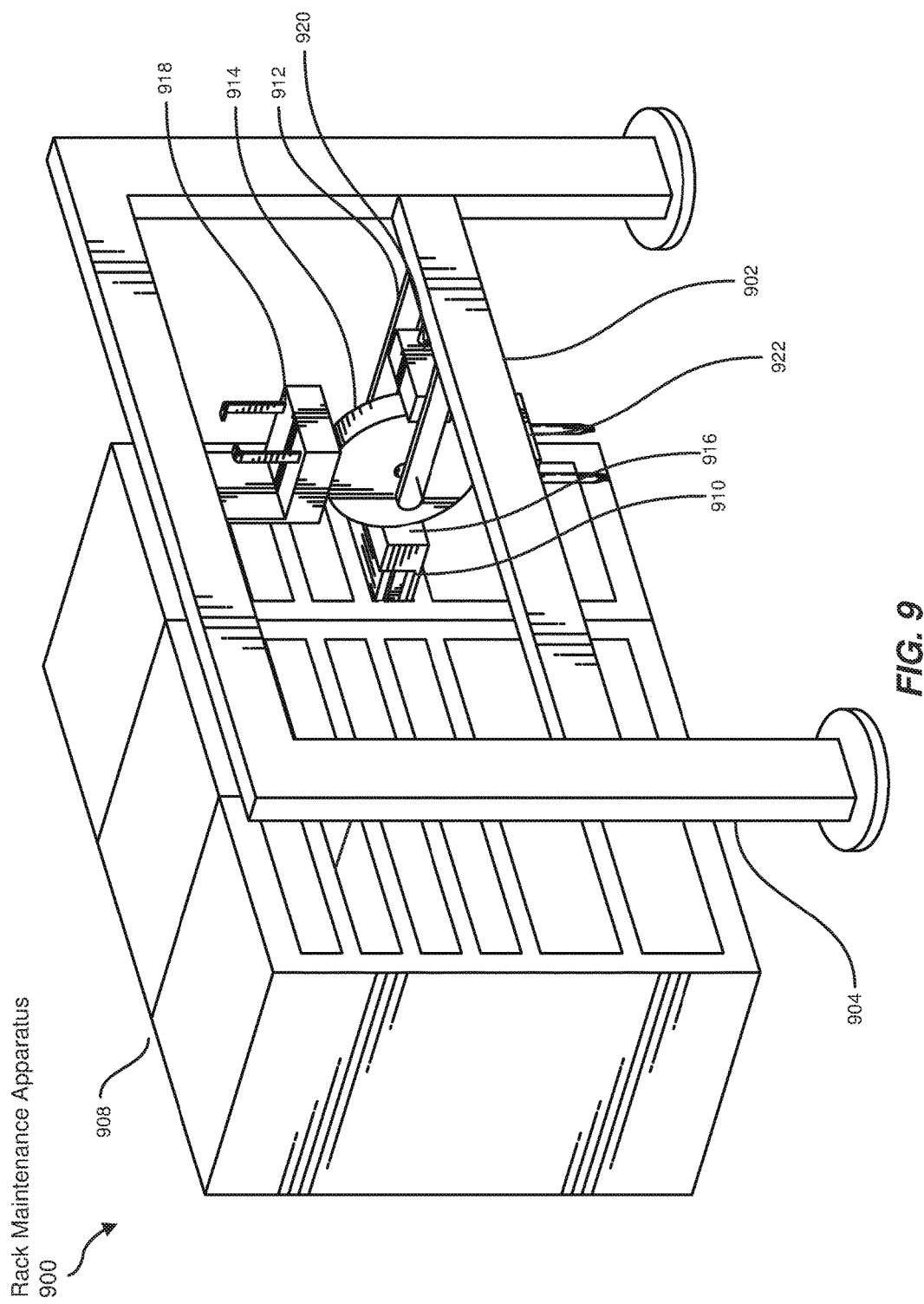
FIG. 9 is a perspective view of a gantry robot and an actuator that moves a robotic arm to relocate a data-center module.

FIG. 9 is a perspective view of a gantry robot 904 and an actuator 902 that moves a robotic arm 912 to relocate an information technology device module 910 as part of rack maintenance apparatus 900. In the example of FIG. 9, gantry robot 904 may facilitate both a vertical movement of actuator 902 and, via actuator 902, a horizontal movement of robotic arm 912. In this example, actuator 902 may move robotic arm 912 to cause robotic arm 912 to relocate information technology device module 910 using a robotic relocation apparatus 914. In some examples, gantry robot 904 may facilitate the setup of a new data center by installing information technology device modules and/or laying and/or terminating cables. Additionally or alternatively, gantry robot 904 may perform maintenance functions in existing data center, such as by relocating information technology device modules held by a rack 908. In one embodiment, robotic arm 912 may include a rotating wheel with multiple different tools for performing different tasks. For example, robotic arm 912 may include an information technology device module grasping tool 916, an alternative information technology device module grasping tool 918, a screwdriver tool 920, and/or an additional screwdriver tool 922. In this example, end screwdriver tool 920 and screwdriver tool 922 may represent different screwdrivers dimensioned to facilitate mounting and/or dismounting information technology device modules.

Additionally or alternatively, a rack maintenance apparatus may include a mobile robot. The term "mobile robot," as used herein, generally refers to any robot that is not attached to a rigid structure. In some embodiments, a single mobile robot may perform rack maintenance operations on a single rack. In other embodiments, multiple rack maintenance robots may perform maintenance operations on a single rack. Additionally or alternatively, one rack maintenance robot may perform maintenance operations on multiple racks.

Figure 10:
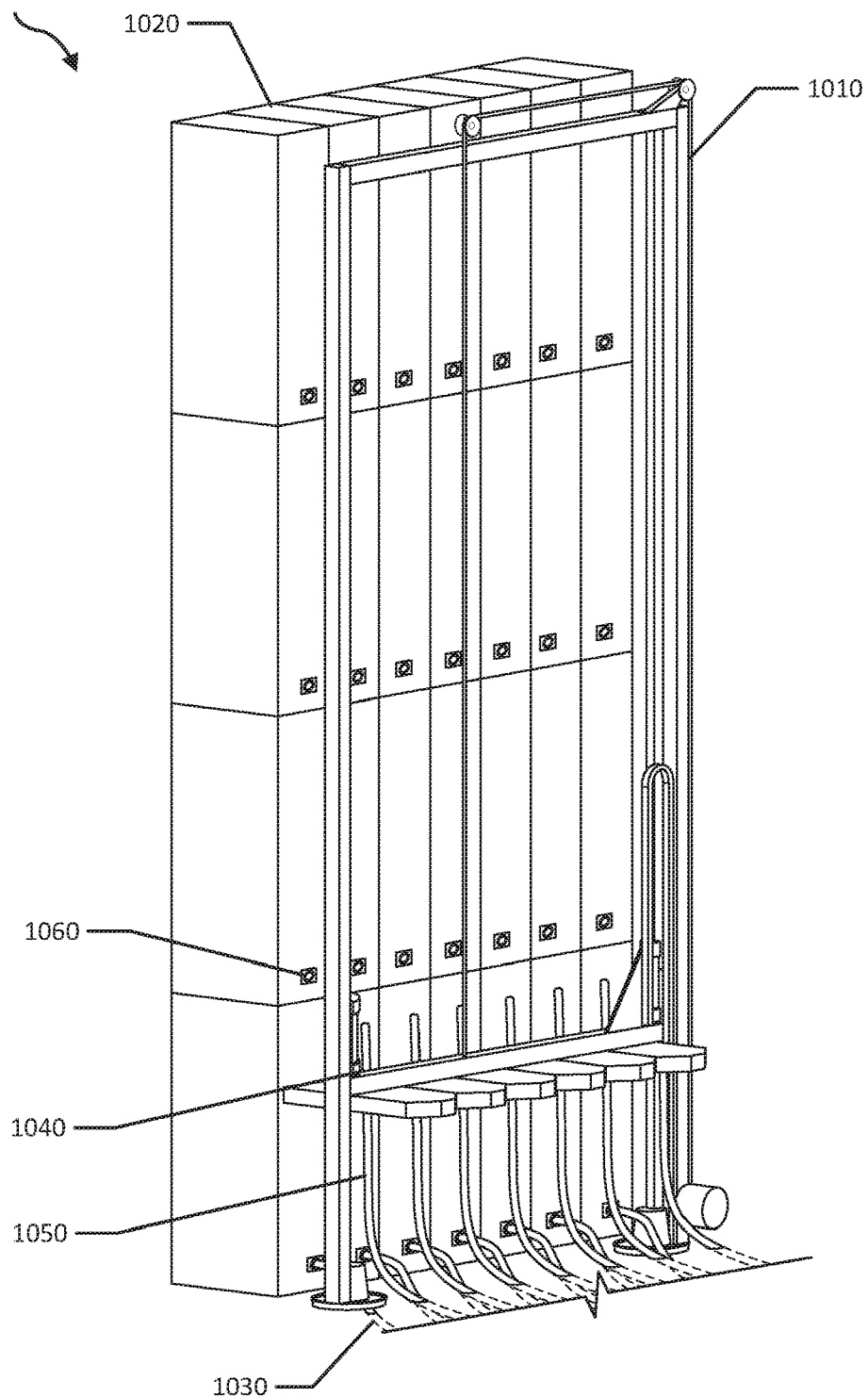
FIG. 10 is a perspective view of an exemplary cable-connection apparatus.

FIG. 10 shows an exemplary cable-configuration apparatus 1000 that may use a gantry robot 1010 to attach one or more cables 1030 to an information technology rack 1020. In some embodiments, gantry robot 1010 may be a rack-maintenance apparatus that has been specially configured to lay and/or terminate cables. In other embodiments, gantry robot 1010 may be a specialized gantry robot for laying and/or terminating cables that may not also function as a rack-maintenance apparatus. An engagement element 1040 on gantry robot 1010 may hold a cable 1050 prior to insertion into information technology rack 1020. Gantry robot 1010 may connect cable 1050 to a connector 1060 in information technology rack 1020 that rigidly holds cable 1050, such as rack system 500 illustrated in FIG. 5. In some embodiments, gantry robot 1010 may connect cables to information technology racks in a data center prior to information technology device modules being placed into the information technology racks and/or connected to the cables. In one embodiment, gantry robot 1010 may operate in the cold aisle of a data center and/or the area that will become the cold aisle once the data center is fully operational. By laying and/or terminating cables, the gantry robot may minimize the amount of human labor needed to set up a data center and/or allow a data center to be constructed in a way that would be inconvenient or impossible for human workers to operate in, such as with very tall racks, horizontal rather than vertical racks, and/or very narrow aisles between racks.

Figure 11:
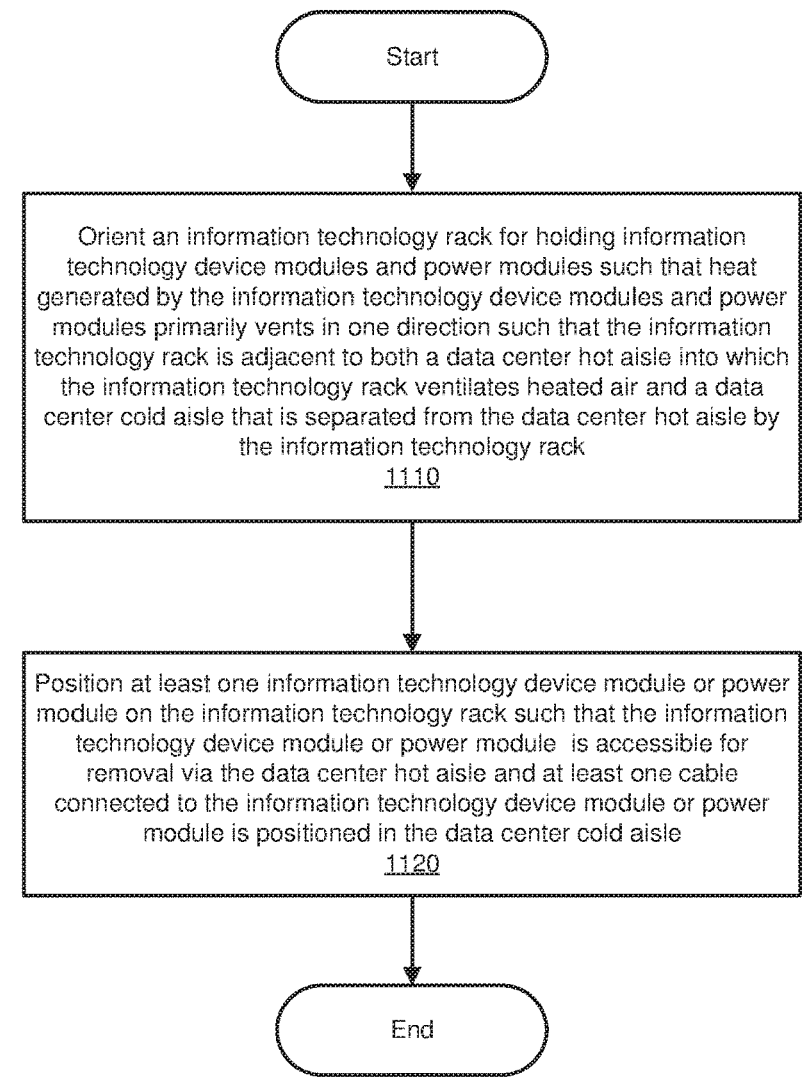
FIG. 11 is a flow diagram of an exemplary method for configuring information technology racks.

FIG. 11 shows, by way of example, a method for manufacturing, assembling, using, adjusting, or otherwise configuring or creating the systems and devices presented herein. In particular, FIG. 11 illustrates a flow diagram of a method 1100 for configuring an information technology rack. As shown in FIG. 11, at step 1110, an information technology rack for holding information technology device modules may be oriented such that heat generated by the information technology device modules primarily vents in one direction. In this example, the information technology rack may be adjacent to both a data center hot aisle into which the information technology rack ventilates heated air and a data center cold aisle that is separated from the data center hot aisle by the information technology rack. For example, information technology device rack 110 may be oriented such that heat generated by information technology modules ventilates into a hot aisle which is separated from a cold aisle by information technology device rack 110.

At step 1120, at least one information technology device module may be positioned on the information technology rack such that the information technology device module is accessible for removal via the data center hot aisle and at least one cable connected to the information technology device module is positioned in the data center cold aisle. For example, information technology device module 120 may be positioned such that information technology device module 120 is accessible for removal via hot aisle 150 and cable 130 is positioned in cold aisle 170.

The process parameters and sequence of the steps described and/or illustrated in FIG. 11 are given by way of example only and can be varied as desired. For example, while the steps illustrated and/or described herein may be shown or discussed in a particular order, these steps do not necessarily need to be performed in the order illustrated or discussed to assemble, manufacture, or use system 100. The various exemplary methods described and/or illustrated in FIG. 11 may also omit one or more of the steps described or illustrated herein or include additional steps in addition to those disclosed.

As discussed throughout the instant disclosure, the disclosed methods, systems, and devices may provide one or more advantages over traditional data center configurations. For example, positioning cables in cold aisles as described herein may increase the efficiency, performance, and/or lifespan of the cables. In addition, the data center configurations disclosed herein may facilitate more efficient arrangements of data center facilities. For example, the deployment mechanisms disclosed herein may facilitate the deployment of modules to data center racks efficiently via the use of gantry robots and/or blind mate connections. By positioning all of the cables in the aisle opposite the access aisle, the systems described herein may enable modules to be accessed more easily without cables stored in the access aisle obstructing access. Thus, the deployment mechanisms described herein may provide potential savings in terms of human labor and/or cable deterioration.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
   an information technology rack configured to hold information technology device modules such that heat generated by the information technology device modules primarily vents in one direction, wherein the information technology rack is adjacent to both:
      a data center hot aisle into which the information technology rack ventilates air heated by one or more of the information technology device modules; and
      a data center cold aisle that is separated from the data center hot aisle by the information technology rack; and
   at least one information technology device module positioned on the information technology rack such that:
      the information technology device module is accessible for removal via the data center hot aisle; and
      at least one cable connected to the information technology device module is positioned in the data center cold aisle.

2. The system of claim 1, wherein each cable connected to the information technology device module is positioned in the data center cold aisle.

3. The system of claim 1, wherein the cable connected to the information technology device module that is positioned in the data center cold aisle is connected to the information technology device module via a blind mate connection.

4. The system of claim 1, wherein the cable connected to the information technology device module that is positioned in the data center cold aisle is rigidly held by the information technology rack.

5. The system of claim 1, wherein:
   the information technology device module comprises a currently operative part of a data center infrastructure; and
   the information technology device module performs at least one of storing, sending, or receiving data.

6. The system of claim 1, wherein the information technology device module is accessible for modification via the data center hot aisle.

7. The system of claim 1, wherein the cable comprises a network cable that connects the information technology device module to a network.

8. A system comprising:
   an information technology rack configured to hold information technology device modules such that heat generated by the information technology device modules primarily vents in one direction, wherein the information technology rack is adjacent to both:
      a data center hot aisle into which the information technology rack ventilates air heated by one or more of the information technology device modules; and
      a data center cold aisle that is separated from the data center hot aisle by the information technology rack;
   at least one information technology device module positioned on the information technology rack such that the information technology device module is accessible for removal via the data center hot aisle; and
   a rack-maintenance apparatus that is configured to replace the information technology device module with a replacement information technology device module via the data center hot aisle.

9. The system of claim 8, wherein the rack-maintenance apparatus is configured to retrieve the replacement information technology device module from a module-dispensing apparatus in the data center hot aisle.

10. The system of claim 8, wherein the rack-maintenance apparatus comprises a gantry robot adapted to move a sliding element parallel to a face of the information technology rack that is adjacent to the data center hot aisle.

11. The system of claim 8, further comprising a cable-configuration apparatus that connects a cable to the information technology rack via the data center cold aisle prior to the information technology device module being connected to the cable, wherein:
   the cable connects the information technology device module to at least one of an additional information technology device module, a power source, or a network; and
   the cable is positioned in the data center cold aisle.

12. The system of claim 8, further comprising a module-dispensing apparatus within the data center hot aisle that stores at least one replacement module for the information technology device module positioned on the information technology rack.

13. The system of claim 8, further comprising a set of cables that comprises both a network cable and a power cable, wherein each cable within the set of cables is coupled to the information technology device module via a blind mate connection.

14. The system of claim 8, further comprising a cooling apparatus that cools the data center cold aisle.

15. A method comprising:
   orienting an information technology rack configured to hold information technology device modules such that heat generated by the information technology device modules primarily vents in one direction, wherein the information technology rack is adjacent to both:
      a data center hot aisle into which the information technology rack ventilates air heated by one or more of the information technology device modules; and
      a data center cold aisle that is separated from the data center hot aisle by the information technology rack; and positioning at least one information technology device module on the information technology rack such that:
the information technology device module is accessible for removal via the data center hot aisle; and
at least one cable connected to the information technology device module is positioned in the data center cold aisle.

16. The method of claim 15, further comprising connecting the cable to the information technology device module via in the data center cold aisle.

17. The method of claim 15, wherein positioning the information technology device module comprises connecting the cable to the information technology device module via a blind mate connection.

18. The method of claim 15, further comprising replacing the information technology device module with a replacement information technology device module via the data center hot aisle.

19. The method of claim 15, further comprising modifying the information technology device module via the data center hot aisle.

20. The method of claim 15, further comprising installing, via a cable-configuration apparatus, the cable in the data center cold aisle prior to installing the information technology device module.

* * * * *